(12) United States Patent
Guerber et al.

(10) Patent No.: US 11,474,316 B2
(45) Date of Patent: Oct. 18, 2022

(54) INTEGRATED DEVICE FOR OPTICALLY COUPLING A FLARED LASER SOURCE AND A WAVEGUIDE

(71) Applicant: Commissariat à l'Energie Atomique et aux Energies Alternatives, Paris (FR)

(72) Inventors: Sylvain Guerber, Grenoble (FR); Daivid Fowler, Grenoble (FR); Bertrand Szelag, Grenoble (FR)

(73) Assignee: Commissariat à l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 17/304,662

(22) Filed: Jun. 24, 2021

(65) Prior Publication Data
US 2021/0405315 A1    Dec. 30, 2021

(30) Foreign Application Priority Data

Jun. 24, 2020    (FR) ...................................... 20 06616

(51) Int. Cl.
*G02B 6/42*    (2006.01)
*G01S 7/484*    (2006.01)
*G01S 7/4911*    (2020.01)

(52) U.S. Cl.
CPC ............ *G02B 6/4296* (2013.01); *G01S 7/484* (2013.01); *G01S 7/4911* (2013.01); *G02B 6/4206* (2013.01)

(58) Field of Classification Search
CPC ................ G02B 6/4296; G02B 6/4206; G02B 2006/12061; G02B 2006/12152;
(Continued)

(56) References Cited

U.S. PATENT DOCUMENTS 5,513,196 A * 4/1996 Bischel .................... H01S 5/141
                                                            372/18
6,996,139 B2 * 2/2006 Barbier ..................... G02B 6/42
                                                           372/50.1
(Continued)

FOREIGN PATENT DOCUMENTS

FR    2 821 166 A1    8/2002

OTHER PUBLICATIONS

French Preliminary Search Report dated Mar. 16, 2021 in French Application 20 06616 filed on Jun. 24, 2020, 10 pages (with English Translation of Categories of Cited Documents & Written Opinion).
(Continued)

*Primary Examiner* — John Bedtelyon
(74) *Attorney, Agent, or Firm* — Oblon, McClelland, Maier & Neustadt, L.L.P.

(57) ABSTRACT

The invention relates to a device for coupling a flared laser source (10) and an output waveguide (3), comprising a coupler (20), a combiner (40), and a network of intermediate waveguides (30) located between the coupler and the combiner and comprising a correcting central section ($S_c$) in which an effective index associated with the guided modes is adjusted so that the optical paths of the intermediate waveguides (30) between the coupler (20) and the combiner (40) are identical to one another.

12 Claims, 6 Drawing Sheets

(58) Field of Classification Search
CPC ............. G02B 6/1228; G02B 6/12009; G02B 6/1245; G02B 2006/12195; G02B 6/12004; G02B 6/2804; G01S 7/484; G01S 7/4911; G01S 7/4814; H01S 5/0225; H01S 5/02251; H01S 5/1014
See application file for complete search history.

(56) References Cited

U.S. PATENT DOCUMENTS

| | | | |
|---|---|---|---|
| 9,316,788 B2* | 4/2016 | Witzens | G02B 6/13 |
| 2004/0052288 A1* | 3/2004 | Barbier | G02B 6/4201 |
| | | | 372/97 |

OTHER PUBLICATIONS

Delepine et al., "How to Launch 1 W Into Single-Mode Fiber From a Single 1.48-µm Flared Resonator", IEEE Journal on Selected Topics in Quantum Electronics, vol. 7, No. 2, 2001, pp. 111-123.
Tu et al., "High-Efficiency Ultra-Broadband Multi-Tip Edge Couplers for Integration of Distributed Feedback Laser With Silicon-on-Insulator Waveguide", IEEE Photonics Journal, vol. 11, No. 4, Aug. 2019, 14 pages.
Kim et al., "Luneburg Lens for Wide-Angle Chip-Scale Optical Beam Steering", Cleo, 2019, 2 pages.
Wenzel et al., "High-brightness diode lasers", C.R. Physique 4, 2003, pp. 649-661.

* cited by examiner

INTEGRATED DEVICE FOR OPTICALLY COUPLING A FLARED LASER SOURCE AND A WAVEGUIDE

TECHNICAL FIELD

The field of the invention is that of on-chip photonic circuits, and more precisely that of optical coupling of a flared laser source to a waveguide of a photonic chip. The invention is notably applicable to the LIDAR field, LIDAR being the acronym of Light Detection and Ranging.

PRIOR ART

Various applications, such as LIDARs, require a semiconductor laser source that emits a high-power optical signal. Such a laser source may be a so-called flared laser source (also called tapered laser source), as notably described in the article by Wenzel et al. titled *High-brightness diode lasers*, C.R. Physique 4 (2003), 649-661.

A flared laser source conventionally comprises (located in the optical cavity) an active waveguide formed from a straight single-mode section followed by a flared section that ends in an emission surface of the laser source. The straight single-mode section may be a ridge section of small transverse dimensions, so as to form a spatial filter and to force the optical signal to be transverse single-mode, and the flared section may ensure the amplification of the optical signal. The emission surface of the laser source may then have a width of the order of one to several hundred microns. Such flared laser sources may thus emit an optical signal of high power, of the order of several watts for example.

However, it is important to be able to couple such a flared laser source to an output waveguide. Optical devices that ensure free-space optical coupling between the flared laser source and a single-mode optical fibre, such as the optical device described in the article by Delepine et al. titled *How to Launch 1 W Into Single-Mode Fiber from a Single 1.48 μm Flared Resonator*, IEEE Journal on Selected Topics in Quantum Electronics, Vol. 7, No. 2, (2001), 111-123, already exist. This type of optical device comprises a set of collimating and focusing lenses that are particularly difficult to position relative to one another, and its coupling performance is highly sensitive to errors in relative position.

It would therefore be desirable to be able to couple the flared laser source to an output waveguide on a photonic chip. However, the intensity of the optical signal emitted by the flared laser source has a very elliptical spatial distribution, its width being of the order of several hundred microns along a horizontal axis, whereas the transverse dimensions of the optical mode supported by the output waveguide may be of the order of only one micron, this making optical coupling particularly difficult to obtain.

It will be noted that planar gradient-index lenses that are able to collimate the incident optical signal have already been produced on a photonic chip. An example of such planar lenses, here a so-called Luneburg lens, is described in the article by Kim et al. titled *Luneburg Lens for Wide-Angle Chip-Scale Optical Beam Steering*, Conference on Lasers and Electro-Optics (CLEO), 2019. However, planar gradient-index lenses are generally photonic crystals and hence they are formed from a plurality of holes of various sub-wavelength diameters produced in a thin silicon layer of an SOI substrate. The holes are arranged so that the effective index of the optical mode exhibits a predefined variation allowing the collimating function to be obtained. However, it turns out that these holes forming the photonic crystal of the lens are particularly complex to produce, and that imperfections in production greatly impact the performance of such an optical device.

DISCLOSURE OF THE INVENTION

The objective of the invention is to at least partially remedy the drawbacks of the prior art, and more particularly to provide a device for optically coupling, on a photonic chip, a flared laser source and an output waveguide that has a high performance, in terms of collection of the emitted optical signal, transmission of the optical signal thus collected, and/or focus onto the input of the output waveguide.

To this end, one subject of the invention is a coupling device suitable for ensuring optical coupling between a flared laser source and an output waveguide on a photonic chip.

The flared laser source comprises, along an optical axis Δ, a straight single-mode section, and a section that is flared (ie. tapered), in a main plane, and that ends in a surface of emission of the optical signal. It is configured to emit an optical signal a wavefront of which, in the main plane, is circular and centred on a position $z_h$ located in the flared section on the optical axis Δ.

According to the invention, the coupling device comprises, placed on the photonic chip:

- a coupler, which is intended to be coupled to the flared laser source so as to collect and transmit at least one portion of the emitted optical signal, and which comprises a curved and circularly arcuate output the centre of which is intended to be located at the position $z_h$;
- a combiner, which is coupled to intermediate waveguides so as to receive the optical signals transmitted by the latter, and to focus them on to an input of the output waveguide; and which is a planar focusing lens comprising an input and an output bounding a free-propagation region of uniform refractive index, the input being curved and circularly arcuate and having a centre at a position $z_{gs}$ on the output face where the input of the output waveguide is located;
- a network of intermediate waveguides, which are coupled to the curved output of the coupler so as to receive the collected optical signal and to transmit it to the curved input of the combiner; and which comprise: a connecting upstream section in which they are orthogonally connected to the curved coupler output; a connecting downstream section in which they are orthogonally connected to the curved combiner input; a correcting central section located between the connecting upstream and downstream sections, in which section an effective index associated with the guided modes is adjusted so that the optical paths of the intermediate waveguides between the curved output of the coupler and the curved input of the combiner are identical to one another.

The following are certain preferred but non-limiting aspects of this coupling device.

The intermediate waveguides may exhibit, in the correcting central section, a longitudinal variation in at least one transverse dimension, said longitudinal variation being predefined for each intermediate waveguide, so that the optical paths of the intermediate waveguides are identical to one another.

Each intermediate waveguide may exhibit, in the correcting central section, an adiabatic variation in width, passing from a minimum first value that is identical for each intermediate waveguide to a maximum value that is different from one intermediate waveguide to the next, before then decreasing to a second minimum value that is identical for each intermediate waveguide.

The coupling device may comprise waveguides that are referred to as additional waveguides, these waveguides having a refractive index different from that of the intermediate waveguides, lying solely in the correcting central section, and each being arranged facing and parallel to one intermediate waveguide, so as to permit modal coupling to the intermediate waveguide in question, the additional waveguides having a predefined length that differs from one additional waveguide to the next, so that the optical paths of the intermediate waveguides are identical to one another.

The coupling device may comprise thermo-optic phase-shifters arranged solely in the correcting central section so as to generate, via the application of a temperature to the intermediate waveguides, a predefined phase shift between the optical modes in the intermediate waveguides so that the optical paths of the intermediate waveguides are identical to one another.

The coupler may be formed from a network of tapers each taper being rectilinear and oriented in the direction of a given position intended to coincide with the position $z_h$, the tapers being arranged laterally so that their downstream ends are placed on a circular arc the centre of which is intended to be located at the position $z_h$, thus forming the curved output of the coupler.

The coupler may be a star coupler comprising an input face intended to be oriented orthogonally to the optical axis Δ, a curved output face, and a free-propagation region of uniform refractive index bounded by the input and output faces.

The invention also relates to a photonic chip comprising a coupling device according to any one of the preceding features, and the output waveguide coupled to the combiner in the position $z_{gs}$ of its curved output.

The photonic chip may comprise a silicon-on-insulator substrate.

The invention also relates to an optoelectronic system, comprising: an emissive chip comprising a flared laser source which comprises, along an optical axis Δ, a straight single-mode section, and a section that is flared in a main plane and that ends in a surface of emission of the optical signal, and which is configured to emit an optical signal a wavefront of which, in the parallel plane, is circular and centred on a position $z_h$ located in the flared section on the optical axis Δ; and a photonic chip according to any one of the preceding features.

The emissive and photonic chips may be joined to each other by an adhesive layer.

BRIEF DESCRIPTION OF THE DRAWINGS

Other aspects, aims, advantages and features of the invention will become more clearly apparent on reading the following detailed description of preferred embodiments thereof, this description being given by way of nonlimiting example and with reference to the appended drawings, in which.

DETAILED DISCLOSURE OF PARTICULAR EMBODIMENTS

In the figures and in the remainder of the description, the same references have been used to designate identical or similar elements. In addition, the various elements have not been shown to scale so as to improve the clarity of the figures. Moreover, the various embodiments and variants are not mutually exclusive and may be combined with one another. Unless otherwise indicated, the terms "substantially", "about" and "of the order of" mean to within 10%, and preferably to within 5%. Moreover, the terms "comprised between . . . and . . . " and equivalents mean that the bounds are included, unless indicated otherwise.

Figure 1:
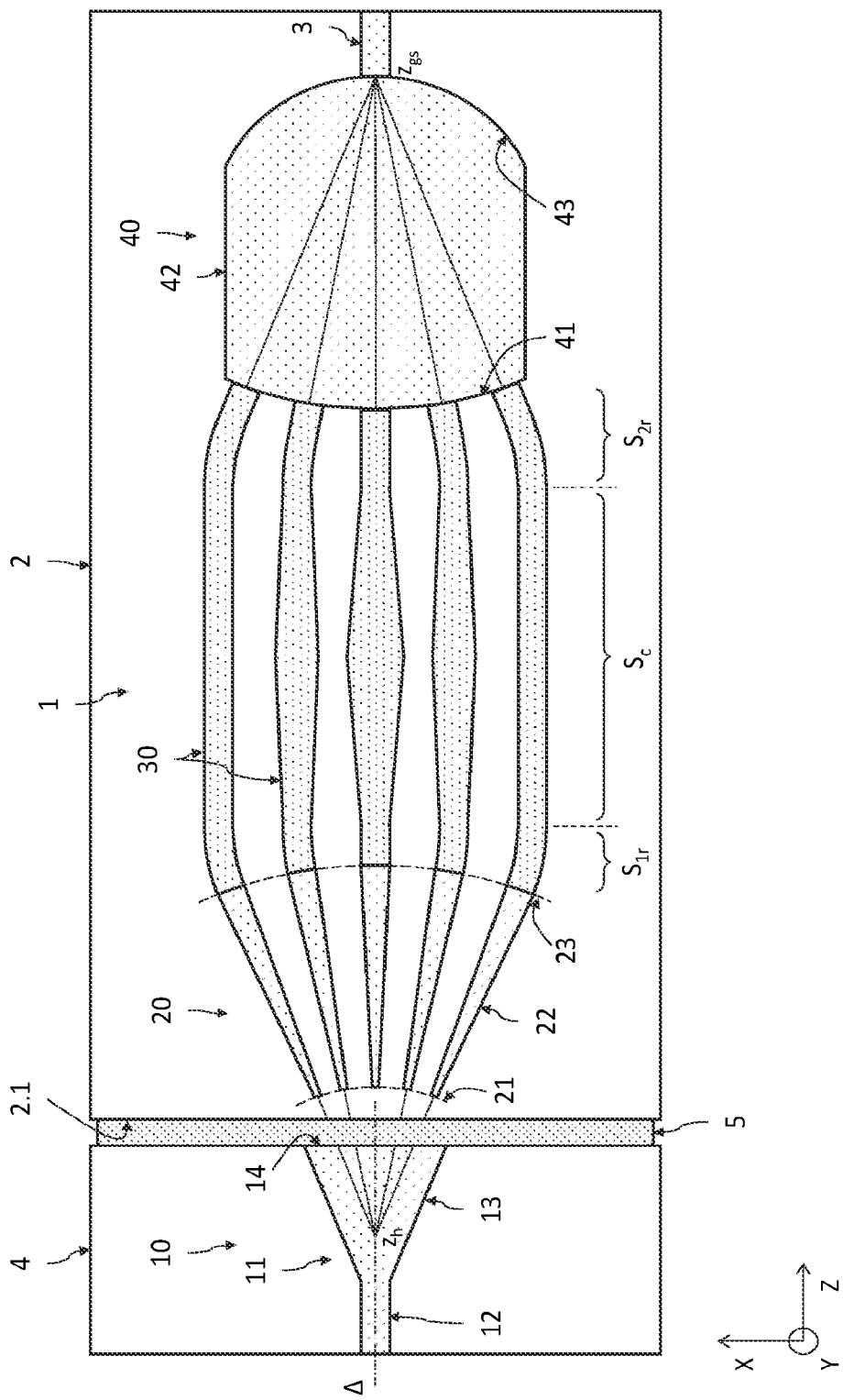
FIG. 1 is a schematic and partial view from above of a flared laser source coupled to an output waveguide by a coupling device according to one embodiment.

FIG. 1 is a schematic and partial view of a coupling device 1 according to one embodiment, ensuring optical coupling between a flared laser source 10 (also called tapered laser source) and an output waveguide 3 of a photonic chip 2.

Generally, the coupling device 1 comprises, placed on the photonic chip 2:
   a coupler 20, which is intended to be coupled to the flared laser source 10 so as to collect at least one portion of the emitted optical signal,
   a network of waveguides that are referred to as intermediate waveguides, which are coupled to the coupler 20 so as to receive and transmit the collected optical signal, and
   a combiner 40 coupled to the intermediate waveguides 30 so as to focus, on to the input of the output waveguide 3, the transmitted optical signals.

A direct orthonormal coordinate system XYZ, in which the XZ-plane is parallel to the main plane of the photonic chip 2, and in which the longitudinal Z-axis is oriented along the optical axis Δ of the flared laser source 10, is defined here and for the rest of the description. The X-axis is called the horizontal axis, and the Y-axis is called the vertical axis. The terms "upstream" and "downstream" refer to positions of increasing distance in the direction of propagation of the optical signal, here in the +Z-direction.

A flared laser source 10 is integrated into a chip 4, which is referred to as the emissive chip. It is designed to emit a pulsed or continuous-wave monochromatic optical signal of wavelength $\lambda_e$ for example equal to about 905 nm, or even to 1550 nm. It is said to be flared in the sense that the active waveguide 11 located in the optical cavity comprises, along an optical axis Δ, a straight single-mode section 12 followed by a flared section 13 that ends in an emission surface 14. Thus, the spatial distribution in an XY-plane of the intensity of the emitted optical signal is elliptical and 'flattened': it has, in the near-field, a small dimension along the vertical Y-axis, for example one of the order of one micron, and a large dimension along the horizontal X-axis, for example one of the order of about one hundred microns, with an aspect ratio (large dimension to small dimension) of the order of 50 to 100, or even more. The flared laser source 10 may be produced in an identical or similar way to that described in the article by Delepine et al. 2001 mentioned above.

The emissive chip 4 is here separate from the photonic chip 2 that comprises the coupling device 1 and the output waveguide 3. It comprises a carrier substrate on which rests an active layer comprising multiple quantum wells that lie in the XZ-plane. The active layer may be flanked, along the vertical Y-axis, by confinement layers. A structured upper layer covers the active layer, in which a waveguide referred to as the active waveguide 11 is formed and extends along the optical axis Δ.

This active waveguide 11 comprises a straight single-mode ridge section 12 that is defined laterally in the XZ-plane by localized etching. This straight single-mode section 12 has transverse dimensions such that it supports, at the emission wavelength $\lambda_e$, only a single guided transverse optical mode, the fundamental transverse mode for example. Moreover, the straight single-mode section 12 performs a modal filtering function in so far as transverse modes of higher orders potentially excited in the flared section 13 are unable to be guided in the straight single-mode section 12.

It also comprises a flared section 13, defined in the XZ-plane of the upper layer by localized doping. The optical mode is then guided therein via the amplifying gain. The section 13 is said to be flared (i.e. tapered) in so far as it has a width, in the XZ-plane, that increases here linearly with distance from the straight single-mode section 12. It may have an angle of inclination with respect to the optical axis Δ of the order of a few degrees, and for example comprised between about 4° and 6°. The flared section 13 delineates the emission surface 14 of the flared laser source 10, which lies orthogonally to the optical axis Δ. The emission surface 14 then has a width $w_{f,max}$, here along the horizontal X-axis, of the order of one to several hundred microns.

It will be noted that a flared laser source 10 is intrinsically astigmatic, in the sense that the plane of the horizontal waist (i.e. the waist in the XZ-plane) is located at a different position to the plane of the vertical waist (i.e. the waist in the YZ-plane). As known, the plane of the waist of a laser source is located in a position in which the (horizontal or vertical) wavefront in question is planar (infinite radius of curvature). As notably indicated in the article Delepine et al. 2001, the plane of the horizontal waist is located in the active waveguide 11, and more precisely in the flared section 13, at a position $z_h$ distant from the emission surface 14 by a nonzero value $\delta_h$ along the optical axis Δ, whereas the plane of the vertical waist is located on the emission surface 14 ($\delta_v$=0).

The distance $\delta_h$ (and therefore the position $z_h$) may be determined using a wavefront analyser.

Thus, the emitted optical signal has, in the XZ-plane, i.e. in the main plane of the emissive chip 4 and the main plane of the photonic chip 2, a circular wavefront the centre of which is located at the position $z_h$. In other words, in the XZ-plane, the optical signal emitted by the flared laser source 10 seems to be emitted from the position $z_h$.

The coupling device 1 is said to be integrated in so far as it is produced on a photonic chip 2. It is designed to optically couple the flared laser source 10 to an output waveguide located on the same photonic chip 2. Thus, as mentioned above, the photonic chip 2 comprises, arranged successively along the axis of propagation of the optical signal, a coupler 20 for collecting at least one portion of the optical signal emitted by the flared laser source 10, a network of intermediate waveguides 30 coupled to the coupler 20 so as to transmit the collected optical signal to the combiner 40, the combiner 40 being coupled to the intermediate waveguides 30 so as to receive the transmitted optical signals and to focus them on to the input of the output waveguide 3.

The photonic chip 2 or photonic integrated circuit (PIC) comprises a carrier substrate (not shown) from which may be produced active photonic components (modulators, diodes, etc.) and passive photonic components (waveguides, multiplexers or demultiplexers, etc.) that are optically coupled to one another. In the context of on-silicon photonics, the carrier substrate and the photonic components are made based on silicon. The carrier substrate may thus be a silicon-on-insulator (SOI) substrate. However, many other technological platforms may be used. Typically, the use of waveguides made of silicon for applications at 905 nm is not recommendable since silicon absorbs at this frequency. Silicon nitride (SiN), aluminium nitride (AlN), guides made of doped silicon, etc. for example will therefore possibly be used.

The photonic chip 2 is here separate from the emissive chip 4. It has a first lateral face 2.1 located facing the emission surface 14 of the emissive chip 4, so that the coupler 20 may collect at least one portion of the optical signal emitted by the flared laser source 10. The photonic chip 2 and the emissive chip 4 are here joined to each other by a layer 5 of an adhesive material, such as an optical adhesive, the refractive index of which is chosen so as to not disrupt the propagation of the optical signal. The refractive index may be identical to that of the cladding material of the waveguides of the coupling device 1. By way of example, the waveguides 30, the coupler 20 and the combiner 40, may be made of a silicon nitride and the cladding of a silicon oxide. In addition, the spacing between the two chips 2, 4 along the longitudinal Z-axis is preferably smaller than 1 μm so as to limit the risk of introducing a phase error and also to limit the optical losses of the coupler. The layer 5 may however not be used, and the emitted optical signal may be transmitted into the air between the two chips.

The coupling device 1 comprises a coupler 20 suitable for collecting and transmitting at least one portion of the optical signal emitted by the flared laser source 10. Generally, the coupler 20 comprises an input 21 for collecting the incident optical signal, and an output 23 for transmitting the collected optical signal.

The coupler 20 is configured so that the output 23 is curved and circularly accurate with a centre (i.e. centre of the cercle) located substantially in the position $z_h$. Thus, the output 23 of the coupler 20 has a curvature that coincides with the curvature of the wavefront of the optical signal emitted by the flared laser source 10 and received by the coupler 20. Thus, the efficacy of collection of the emitted optical signal and the efficacy of transmission are optimized, and introduction of a phase error into the transmitted optical signal is also avoided. The slight difference between the wavefront of the optical signal emitted by the source 10 and the wavefront of the optical signal received by the coupler 20, due to the difference between the refractive index of the material of the active layer of the source 10 and the material of the coupler 20, may be taken into account here.

Moreover, the collection input 21 has transverse dimensions in the XY-plane that preferably have an aspect ratio at least of the same order of magnitude as that of the spatial distribution of the intensity of the emitted optical signal. More precisely, the collection input 21 has, along the vertical Y-axis, a height corresponding to the thickness of a guiding layer of the photonic layer in which the coupler 20 and the waveguides 30 are produced, which for example is of the order of one micron (from a few tens of nanometres to a few microns), and a width along the horizontal X-axis of the order of one to several hundred microns. Thus, the coupler 20 is able to receive a substantial portion of the emitted optical signal.

In this embodiment, the coupler 20 is formed from a network of tapers 22 (i.e. tapered waveguides) that each collect one portion of the incident optical signal. These tapers 22 have a width in the XZ-plane that increases monotonically, and here linearly, along the Z-axis in an adiabatic manner, so as to optimize coupling efficacy.

The tapers 22 all have identical dimensions, in terms of length $L_{gp}$ and of transverse dimensions $w_{gp}(z)$. They are rectilinear and are each oriented in the direction of the position $z_h$ of the flared laser source 10. The upstream ends of the tapers 22, and the downstream ends, are arranged on a circular arc the centre of which is located at the position $z_h$. The upstream ends of the waveguides 22 define the collection input 21 of the coupler 20, which input is here curved and circularly arcuate, and the downstream ends of the waveguides define the transmission output 23 of the coupler 20, which output is here also curved and circularly arcuate.

Figure 2A:
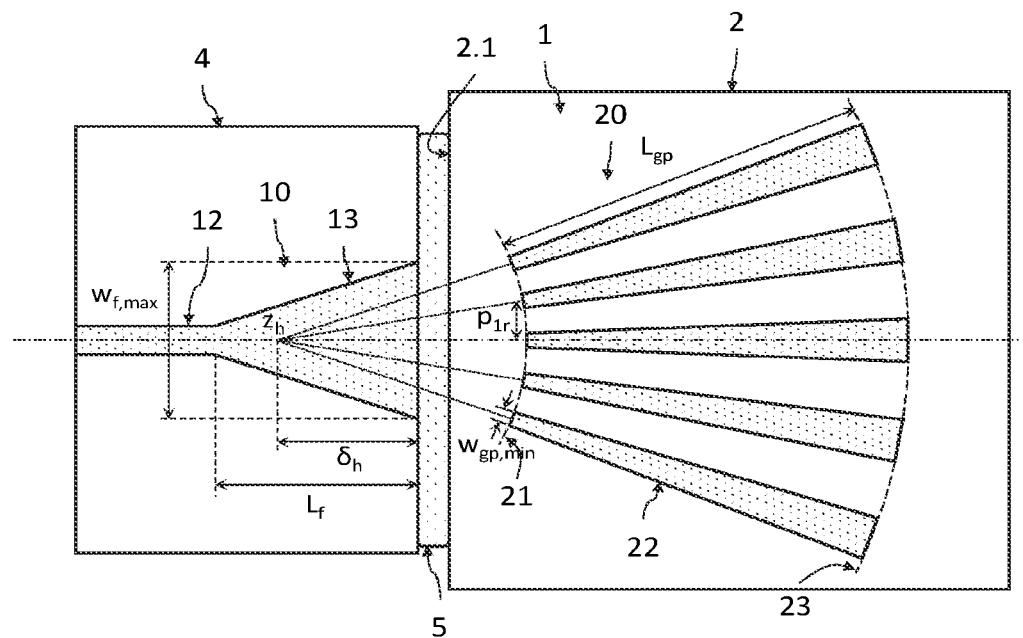
FIG. 2A is a detailed view of one portion of the coupling device illustrated in FIG. 1, more precisely illustrating the flared laser source and the coupler of the coupling device.

By way of example, as illustrated in FIG. 2A, which is a schematic and partial view from above illustrating in detail the flared laser source 10 and the coupler 20, the flared laser source 10 may emit an optical signal at a wavelength $\lambda_e$ equal to 905 nm. The flared section 13 has a length $L_f$ of 2000 µm and a maximum width $w_{f,max}$ of 150 µm level with the emission surface 14. The flared laser source 10 here has an astigmatism such that the distance $\delta_h$ is equal to about 600 µm. The coupler 20 here comprises 130 tapers 22 that are produced in the guiding layer (which is made of a silicon nitride of a thickness of 0.3 µm) and arranged at the input 21 of the coupler 20 with a pitch along the X-axis equal to about 1.3 µm, thus allowing more than 90% of the emitted optical signal to be collected. The aspect ratio of the collection input of the coupler 20 (horizontal dimension to the vertical dimension) is therefore here of the order of about 500. Each taper has a length $L_{gp}$ of 100 µm, a minimum width $w_{gp,min}$ of 0.1 µm at its upstream end (tip), and a maximum width $w_{gp,max}$ of 600 nm at its downstream end, thus allowing a transmission efficacy of more than 95% of the collected optical signal to be obtained.

Thus, the coupler 20 has high collection and transmission efficacies in so far as the output 23, and here also the input 21, is curved and circularly accurate and has its centre at the position $z_h$, i.e. it has a curvature substantially identical to that of the wavefront of the emitted optical signal. Introduction of phase errors into the optical signals transmitted by the various tapers 22 is also avoided. Moreover, the collection input 21 of the coupler 20 advantageously has transverse (horizontal along the X-axis, and vertical along the Y-axis) dimensions at least of the same order of magnitude as those of the spatial distribution in the XY-plane of the intensity of the emitted optical signal, thus improving collection efficacy.

The coupling device 1 comprises a network of a plurality of waveguides 13 that are referred to as intermediate waveguides, here arranged laterally along the horizontal X-axis, which ensure the coupling between the output 23 of the coupler 20 and the input 41 of the combiner 40. The intermediate waveguides 30 each comprise, along the axis of propagation of the optical signal, three sections, namely:

a connecting upstream section $S_{1r}$, in which the upstream end of the intermediate waveguides 30 is coupled to the curved output 23 of the coupler 20;

a phase-correcting central section $S_c$, in which the effective indices of the guided modes are adjusted so that the optical paths of the intermediate waveguides 30 are identical to one another; and a connecting downstream section $S_{2r}$, in which the downstream end of the intermediate waveguides 30 is coupled to the curved input 41 of the combiner 40.

As detailed below, in so far as the combiner 40 is a planar focusing lens comprising a free-propagation region (FPR), it has an input face 41 the circularly arcuate curvature of which allows the incident optical signals (transmitted by the intermediate waveguides 30) to be focused onto a point $z_{gs}$ on its output face 43. In other words, the position $z_{gs}$ is located substantially at the focal point of the focusing lens that is the combiner 40.

This implies that the optical signals transmitted by the intermediate waveguides 30 have, at the input face 41 of the combiner 40, a circularly arcuate wavefront that coincides with the radius of curvature of the input face 41 of the combiner 40, i.e. the centre of which is located at the position $z_{gs}$ on the output face 43. To this end, the intermediate waveguides 30 have, between the connecting upstream and downstream sections, a correcting central section $S_c$ that is designed to correct the phase front of the optical signals transmitted by the coupler 20 so that it has, at the input face 41 of the combiner 40, a curvature that is substantially identical to that of the input face 41 of the combiner 40. Thus, the combiner 40 has a high efficacy as regards focusing the incident optical signals onto the input of the output waveguide 3.

In the connecting upstream section $S_{1r}$, the intermediate waveguides 30 are connected, at their upstream end, orthogonally to the curved output 23 of the coupler 20. They comprise a segment that is curved in the XZ-plane so as to connect to the rectilinear segment of the intermediate waveguides 30 in the correcting central section $S_c$. Preferably, in the connecting upstream section $S_{1r}$, the intermediate waveguides 30 have transverse dimensions (in particular a width $w_{1r(i)}$) that are identical from one intermediate waveguide 30 to the next, and a length $L_{1r(i)}$ that may vary from one intermediate waveguide 30 to the next. The index of the rank of the intermediate waveguide 30 in question is denoted i, i ranging from 1 to N, N being higher than 1 and for example equal to about 100, and to 130 for example.

In the connecting downstream section $S_{2r}$, the intermediate waveguides 30 are connected, at their downstream end, orthogonally to the curved input face 41 of the combiner 40. They comprise a segment that is curved in the XZ-plane so as to be able to connect to the rectilinear segment of the intermediate waveguides 30 in the correcting central section $S_c$. Preferably, in the connecting downstream section $S_{2r}$, the intermediate waveguides 30 have transverse dimensions (in particular a width $w_{2r(i)}$) that are identical from one intermediate waveguide 30 to the next, and have a length $L_{2r(i)}$ that may vary from one intermediate waveguide 30 to the next.

In the correcting central section $S_c$, the intermediate waveguides 30 extend rectilinearly and are parallel to one another. The effective index of the guided modes in this central section $S_c$, is adjusted locally so that the optical paths of the intermediate waveguides 30 are identical to one another. They have a length $L_{c(i)}$ that is preferably identical from one intermediate waveguide 30 to the next. In this central section $S_c$, the intermediate waveguides 30 exhibit a local modification of the effective index $n_{eff,c(i)}$ of the guided mode so that the optical paths between the upstream and downstream ends of the intermediate waveguides 30 are identical from one intermediate waveguide 30 to the next.

Generally, the effective index $n_{eff}$ associated with an optical mode supported by a waveguide is defined as the product of the propagation constant $\beta$ and of $\lambda/2\pi$. The propagation constant $\beta$ depends on the wavelength $\lambda$ of the optical mode, and on the properties of the waveguide (refractive index and transverse dimensions). The effective index of the optical mode corresponds, in a certain way, to the refractive index of the waveguide 'seen' by the optical mode. It is conventionally comprised between the index of the core and the index of the cladding of the waveguide.

Moreover, generally, the optical path of a waveguide is equal to the product of its physical length L and of the effective index $n_{eff}$ of the guided mode. Here, an intermediate waveguide of rank i has a length $L_{1r(i)}$ and a width $w_{1r(i)}$ in the upstream section, a length $L_{c(i)}$ and a width $w_{c(i)}$ in the central section $S_c$, and a length $L_{2r(i)}$ and a width $w_{2r(i)}$ in the downstream section. The guided mode in an intermediate waveguide 30 of rank i has an effective index that is denoted $n_{eff,1r(i)}$ in the upstream section, $n_{eff,c(i)}$ in the central section $S_c$, and $n_{eff,2r(i)}$ in the downstream section. The optical path of an intermediate waveguide is defined between its upstream end connected to the curved output 23 of the coupler 20, and its downstream end connected to the curved input 41 of the combiner 40.

Thus, generally, the effective index of the modes guided in the intermediate waveguides 30 is adjusted, in the correcting central section $S_c$, so that the following equation is respected by all the intermediate waveguides 30:

$$\forall i, n_{eff,1r(i)}(w_{1r(i)}) \times L_{1r(i)} + \int_0^{L_{c(i)}} n_{eff,c(i)}(w_{c(i)})dL + n_{eff,2r(i)}(w_{2r(i)}) \times L_{2r(i)} = A \quad \text{[Math. 1]}$$

where A is a nonzero constant that is identical for all the intermediate waveguides 30.

A plurality of options may be employed to make the optical paths of the intermediate waveguides 30 identical. One option (illustrated in FIGS. 1 and 2B) consists in modifying the transverse dimensions of the intermediate waveguides 30 in the correcting central section $S_c$, in one portion $L_{gc(i)}$ of the length $L_{c(i)}$, so as to correct the effective index $n_{eff,c(i)}$ of the guided mode in each of the intermediate waveguides 30. Another option (illustrated in FIG. 3A) consists in performing modal coupling between each intermediate waveguide 30 and one additional waveguide 31 located facing the latter along the vertical Y-axis and having a refractive index different from that of the subjacent intermediate waveguide 30, so as to obtain a supermode over a given length $L_{sm(i)}$ locally. Another option (illustrated in FIG. 3B) consists in actively controlling the effective index of the guided mode in each intermediate waveguide 30, by means of additional thermo-optic phase-shifters 32 (heaters).

Figure 2B:
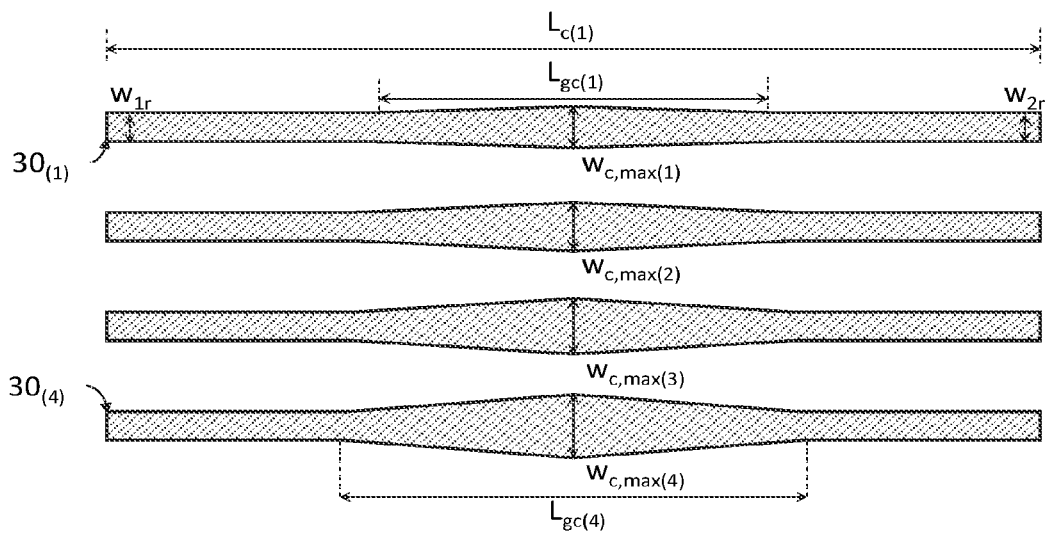
FIG. 2B is a detailed view of one portion of the coupling device illustrated in FIG. 1, more precisely illustrating the intermediate waveguides in the correcting central section, in which they exhibit a longitudinal variation in local width.
Figure 2B:
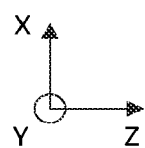

FIG. 2B is a schematic and partial view from above of a plurality of intermediate waveguides 30 level with the correcting central section $S_c$. In this example, the thickness of the intermediate waveguides 30 remains constant and identical from one intermediate waveguide 30 to the next.

Outside of the correcting central section $S_c$, the intermediate waveguides 30 have a width $w_{1r(i)}$ and $w_{2r(i)}$ that is constant and identical from one intermediate waveguide 30 to the next. The widths $w_{1r(i)}$ and $w_{2r(i)}$ may be equal to each other.

In the correcting central section $S_c$, the intermediate waveguides 30 exhibit a longitudinal variation in width $w_{c(i)}(z)$ over at least one portion $L_{gc(i)}$ of the length $L_c$ of the central section $S_c$. In this example, the longitudinal variation in width is monotonic, and here linear, but non-monotonic variations are possible. Thus, the intermediate waveguides 30 have a maximum width $w_{c,max(i)}$, which is different from one intermediate waveguide 30 to the next, over a length $L_{gc(i)}$ that may be identical or not from one intermediate waveguide to the next, so that the optical paths of the intermediate waveguides 30 are identical over their entire length.

In this example, the intermediate waveguides 30 exhibit a linear longitudinal variation in the local width $w_{c(i)}(z)$, which passes from the initial value $w_{1r}$ to the maximum value $w_{c,max(i)}$, before then decreasing to the final value $w_{2r}$. The half-length $L_{gc(i)}/2$ is chosen so that the longitudinal variation in width is adiabatic, i.e. with minimum, or even zero, optical losses. It may be equal, by way of example, to about 25 μm or 50 μm.

The maximum widths $w_{c,max(i)}$ differ from one intermediate waveguide 30 to the next, so as to induce a variation in the effective index $n_{eff,c(i)}$ of the guided mode for each intermediate waveguide, resulting in identical optical paths for all the intermediate waveguides 30. Thus, the wavefront of the transmitted optical signals has, at the input face 41 of the combiner 40, a curvature substantially identical to that of the input face. Any degradation in the phase information associated with the guided modes is limited or avoided, this allowing the efficacy with which the combiner 40 focuses onto the input of the output waveguide 3 to be optimized.

Figure 3A:
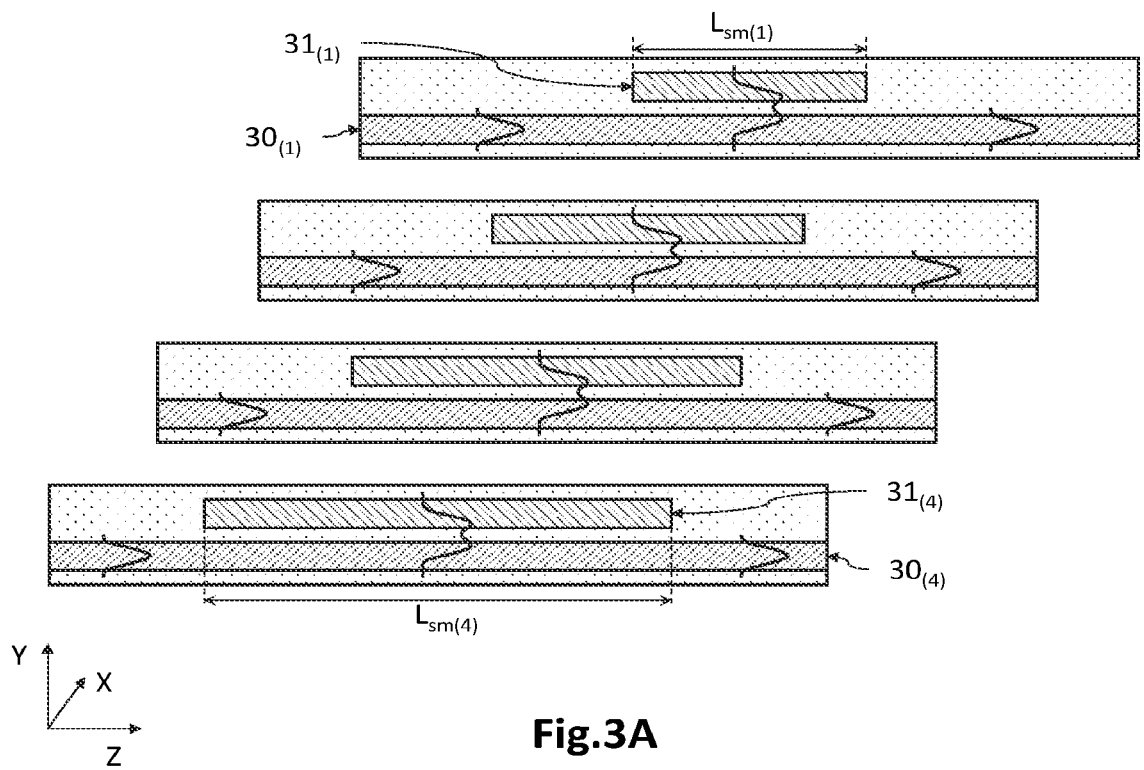
FIG. 3A is a detailed, exploded view in longitudinal cross section of one portion of a coupling device according to one variant of the embodiment illustrated in FIG. 1, more precisely illustrating the intermediate waveguides in the correcting central section, in which they are coupled to additional waveguides in order to form supermodes.

FIG. 3A is a schematic and partial view in longitudinal cross section of a plurality of adjacent intermediate waveguides 30 of a coupling device 1 according to one variant of the embodiment illustrated in FIG. 1, in which the intermediate waveguides 30 are each coupled, in the correcting central section $S_c$, to additional waveguides 31. The waveguides are illustrated exploded.

In this variant, additional waveguides 31 are placed facing the intermediate waveguides 30 along the Y-axis so as to permit modal coupling between the two superposed waveguides. The additional waveguides 31 have a refractive index that is different from that of the intermediate waveguides 30, and preferably higher. Preferably, the intermediate waveguides 30 have transverse dimensions (in particular the width $w_c$) that remain constant over their entire length $L_c$. Also preferably, the upper waveguides also have transverse dimensions (thickness and width) that remain constant over their entire length. A cladding, which is for example made of a silicon oxide, encircles the superposed waveguides.

Thus, the guided mode propagating through an intermediate waveguide 30 extends spatially both into the intermediate waveguide in question and into the upper waveguide, thus forming a supermode. Modal coupling is thus spoken of. More precisely, the component of the electric field of the supermode has a spatial distribution that covers the intermediate waveguide 30 and the upper waveguide 31. The modal coupling is ensured via a suitable vertical spacing of the upper waveguides with respect to the intermediate waveguides 30, this spacing for example being equal to a few tens of to a few hundred nanometres.

Thus, via the modal coupling between the two superposed waveguides 30, 31, the guided mode has an effective index (due to the modal coupling) that differs in the correcting central section $S_c$ from that outside of the correcting central section $S_c$. The difference in length $L_{sm(i)}$ between the upper waveguides in the correcting central section $S_c$ induces a variation in the effective index $n_{eff,c(i)}$ of the guided mode for each of the intermediate waveguides 30. Thus, as illustrated in FIG. 3A, the length $L_{sm(1)}$ of the upper waveguide 31 associated with the intermediate waveguide 30 of rank 1 has a value lower than that of $L_{sm(2)}$, which is itself lower than $L_{sm(3)}$. Thus, the guided mode propagating through the intermediate waveguide 30 of rank 3 has an optical path equal to that of the intermediate waveguide of rank 2, and that of the intermediate waveguide 30 of rank 1. Thus, the length $L_{sm(i)}$ of the upper waveguides is predefined for each intermediate waveguide 30 so that the optical paths of the intermediate waveguides 30 are identical from one intermediate waveguide 30 to the next.

Figure 3B:
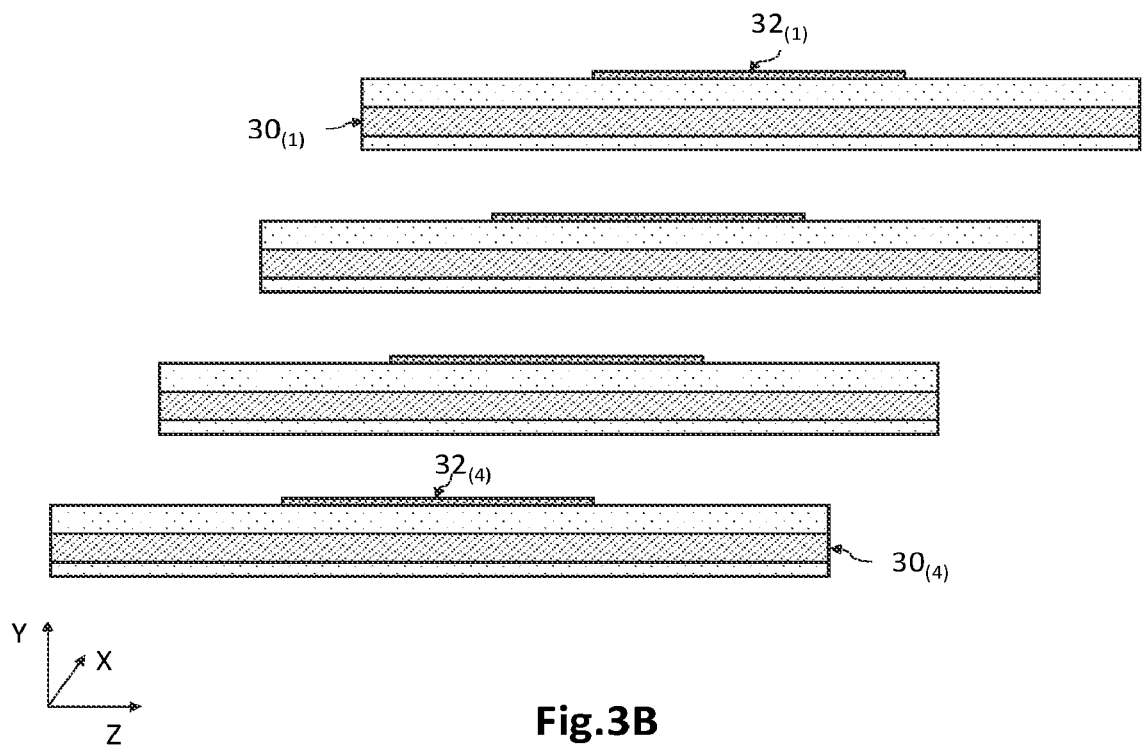
FIG. 3B is a detailed, exploded view in longitudinal cross section of one portion of a coupling device according to another variant of the embodiment illustrated in FIG. 1, more precisely illustrating the intermediate waveguides in the correcting central section, in which thermo-optic phase-shifters are designed to apply a temperature inducing a variation in the refractive index of the subjacent intermediate waveguide.

FIG. 3B is a schematic and partial view in longitudinal cross section of a plurality of adjacent intermediate waveguides 30 of a coupling device 1 according to another variant of the embodiment illustrated in FIG. 1, in which the intermediate waveguides 30 are each associated, in the correcting central section $S_c$, with one thermo-optic phase-shifter 32. The waveguides 30 are illustrated exploded. This variant embodiment may be combined with the other variants and embodiments presented here.

Here, the effective index of the guided mode of each of the intermediate waveguides 30 is varied actively by means of a plurality of additional phase-shifters 32, which are preferably thermo-optic in order to limit optical losses, each phase-shifter being placed facing along the Y-axis of one intermediate waveguide, in the correcting central section $S_c$. As in the example of FIG. 3A, the intermediate waveguides 30 preferably have transverse dimensions (thickness and width) that remain constant over their entire length.

The value of the temperature applied by each thermo-optic phase-shifter 32 is predetermined depending on the variation in effective index to be obtained in each of the intermediate waveguides 30, so as to equalize the optical paths of the intermediate waveguides. Thus, any degradation of the phase information carried by the guided modes in the intermediate waveguides 30 is limited or avoided, and hence the wavefront of the optical signals at the input face 41 has the same curvature as the latter, thus optimizing the efficacy with which the combiner 40 focuses.

In this variant, any phase errors may thus be taken into account and compensated for dynamically. These phase errors may originate from a degradation over time in certain elements of the flared laser source 10 and/or of the coupling device 1, from non-zero non-uniformities or tolerances in the manufacturing process, from the impact of the environment of the optoelectronic system, etc. This variant is especially advantageous as the position $z_h$, from which the emission of the optical signal is "seen" in the horizontal XZ-plane, may be modified, notably depending on the power of the emitted optical signal or on the temperature of the flared laser source 10.

A control module (not shown) may be connected to the thermo-optic phase-shifters 32. Depending on the electrical control signals sent by the control module to the thermo-optic phase-shifters 32, the latter may induce a defined phase shift $\Delta\varphi$ so as to thus correct any phase errors and therefore to obtain the desired wavefront at the input face of the combiner 40, i.e. the one that optimizes focusing efficacy. A photodetector (not shown) may be coupled to the output waveguide 3 and thus measure the intensity of the optical signal propagating through the output waveguide 3, and transmit to the control module the measured value. Depending on the intensity value measured by the photodetector, the control module may, on the basis of this measured intensity value, determine a value of the phase shift $\Delta\varphi$ to be applied by the thermo-optic phase-shifters 32 to the optical signals propagating through the intermediate waveguides 30, so as to correct any phase errors and thus improve focusing efficacy.

The coupling device 1 lastly comprises a combiner 40 that is designed to receive the optical signals transmitted by the intermediate waveguides 30 and to focus them onto the input of the output waveguide 3. The combiner 40 is a planar focusing lens that is designed to focus, onto the position $z_{gs}$ on its output face 43, optical signals incident on its input face 41. In this example, the optical axis of the combiner 40 coincides with the longitudinal Z-axis, but as a variant this may not be the case.

To this end, the combiner 40 comprises an input face 41, an output face 43, and a free-propagation region (FPR) 42 located between the input and output faces 41, 43. The input face 41 is curved and circularly arcuate and has its centre at the position $z_{gs}$. Moreover, the combiner 40 is a lens that is said to be planar in so far as the FPR 42 lies in the XZ-plane of the photonic chip 2.

In this FPR 42, the optical field is confined along the vertical Y-axis, but the optical signal may propagate freely in the XZ-plane. The FPR 42 is defined by a medium the refractive index of which is uniform in the XZ-plane, unlike a gradient-index lens such as mentioned above with reference to the article Kim et al. 2019. In other words, the FPR has a refractive index that is identical at every point in this region in the XY-plane and along the Y-axis. With respect to a gradient-index lens, such a combiner 40, i.e. a combiner that is a planar focusing lens comprising an FPR, is simpler to produce and allows the impact of manufacturing tolerances on its performance to be limited.

Such a combiner 40 is also called a star coupler. It ensures the incident optical signals are focused onto the position $z_{gs}$. In other words, the incident optical signals propagate into the FPR 42 and converge on the position $z_{gs}$ where the output waveguide 3 starts. In so far as the optical signals incident on the input face 41 have a wavefront having, by virtue of the correcting central section $S_c$ of the intermediate waveguides 30, substantially the same curvature as the input face 41, focusing efficacy is optimal. It will be noted that the combiner 40 may be a star coupler such as shown in FIG. 1, or be an echelle grating, which is one particular instance of a star coupler.

Figure 4:
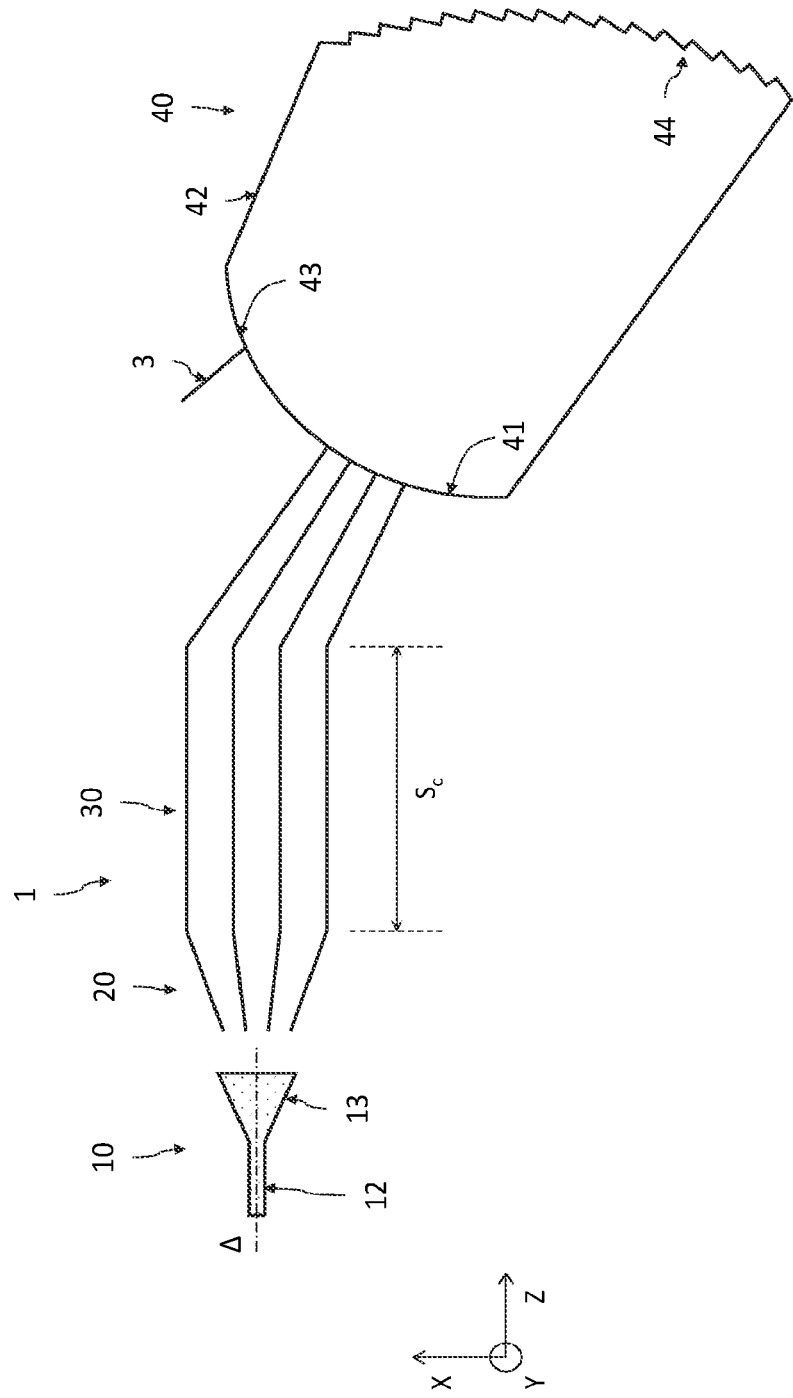
FIG. 4 is a schematic and partial view from above of a coupling device according to another variant of the embodiment illustrated in FIG. 1, in which the combiner is an echelle grating.

In this respect, FIG. 4 is a schematic and partial view from above of a coupling device 1 according to another variant of the first embodiment, in which the combiner 40 is an echelle grating. The input face 41 and the output face 43 are regions of the same curved face located on the side of the intermediate waveguides 30. A reflective face 44 opposite the input and output regions bounds therewith the FPR 42 of uniform refractive index. The reflective face 44 comprises a grating of elementary reflectors that reflect in the direction of the focal position $z_{gs}$ of the output face 43, at which the output waveguide 3 starts.

Thus, the coupling device 1 is able to collect a substantial portion of the optical signal emitted by the flared laser source 10, and to effectively transmit it to an output waveguide 3 that is preferably single-mode. The coupling device 1 is produced on a photonic chip 2, this allowing complexity as regards the relative positions of its various optical elements to be decreased, contrary to free-space coupling devices as in the article Delepine et al. 2001 mentioned above.

Moreover, the coupling device 1 has a high efficacy as regards collection of the optical signal emitted by the flared laser source 10, in so far as the coupler 20 has, on the one hand, a curved and circularly arcuate output 23 that is coincident with the curvature of the wavefront of the emitted optical signal, and, on the other hand, an input 21 the, horizontal and vertical, transverse dimensions of which naturally match those of the elliptical and flattened spatial distribution of the intensity of the emitted optical signal.

The coupling device 1 also has a high efficacy as regards focusing on to the input of the output waveguide 3, on the one hand because of the use of a star-coupler combiner 40 the input face 41 of which is curved to focus the incident optical signals onto the input of the output waveguide 3, and, on the other hand, because of the equalization of the optical paths of the intermediate waveguides 30 via the central section $S_c$ for correcting the wavefront of the transmitted optical signals.

Moreover, the coupling device 1 permits the phase shift applied to the optical signals transmitted in the intermediate waveguides 30 to be dynamically adjusted, as described above with reference to FIG. 3B.

Figure 5:
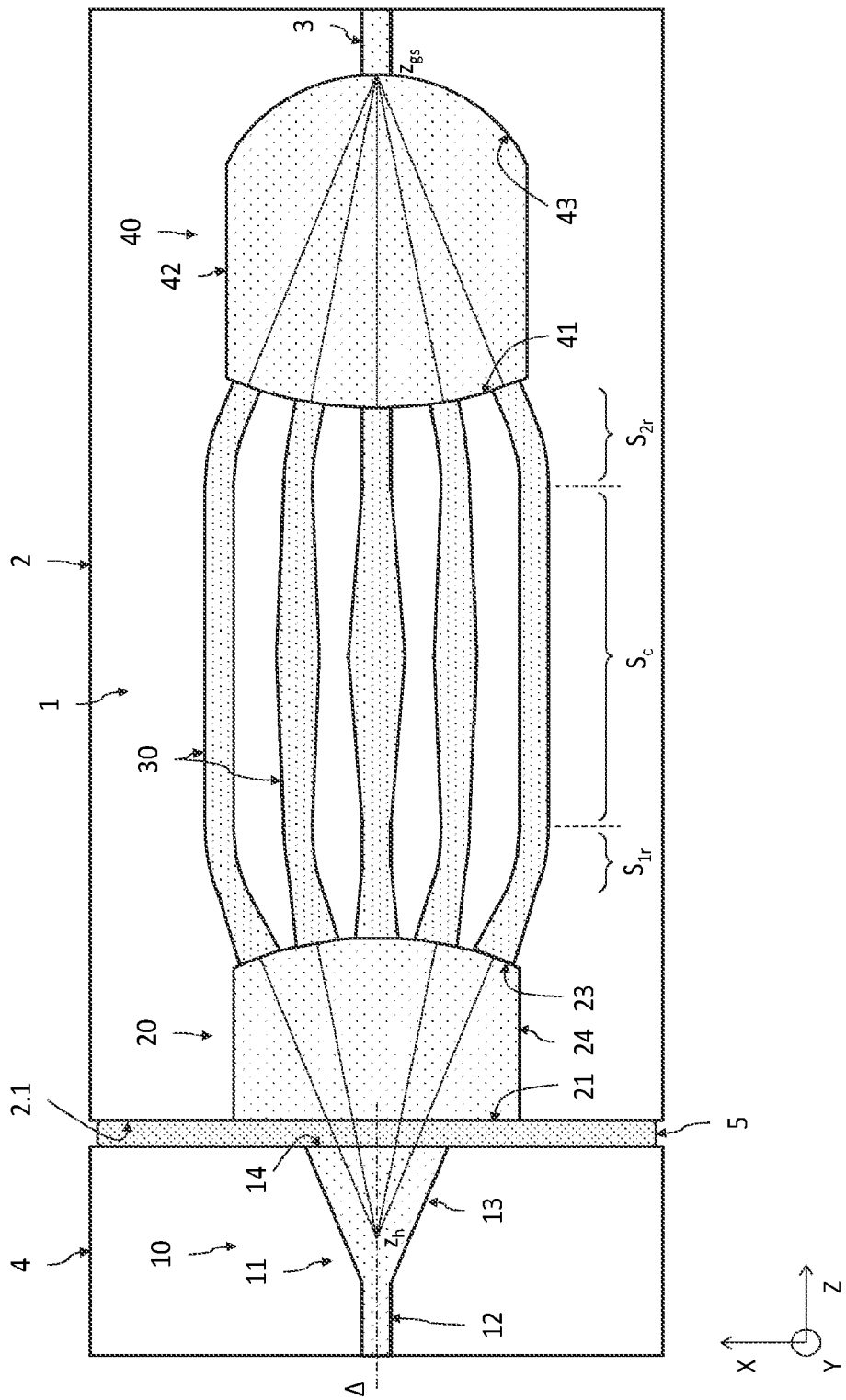
FIG. 5 is a schematic and partial view from above of a coupling device according to another variant of the embodiment illustrated in FIG. 1, in which the coupler is a star coupler.

FIG. 5 is a schematic and partial view from above of a coupling device 1 according to another variant of the embodiment illustrated in FIG. 1, in which the coupler 20 is a star coupler.

Thus, the coupler 20 comprises an input face 21, which here is orthogonal to the optical axis Δ and located facing the flared laser source 10, an output face 23 having a circularly arcuate curvature the centre of which is positioned in the position $z_h$ of the flared laser source 10, and an FPR 24 bounded by the input and output faces 21, 24. The coupler 20 according to this variant has the advantage of avoiding the impact that the minimum value $w_{1r,min}$ of the width of the tapers 22 presented above inf FIG. 2A has on the collection efficacy.

The intermediate waveguides 30, in the connecting upstream section $S_{1r}$, have a width $w_{1r}$ that decreases from a value $w_{1r,max}$ at the output face 23 of the coupler 20, preferably adiabatically, to reach a minimum value $w_{1r,min}$ at the input of the correcting central section $S_c$. By way of example, the value $w_{1r,max}$ may be equal to 2 or 3 times the minimum value $w_{1r,min}$. Thus, the intermediate waveguides 30 collect a substantial portion of the optical signal received by the coupler 20, this allowing, for a given collection width, the number N of intermediate waveguides 30 to be decreased.

Particular embodiments have just been described. Various variants and modifications are possible without departing from the scope of the invention.

Figure 6A:
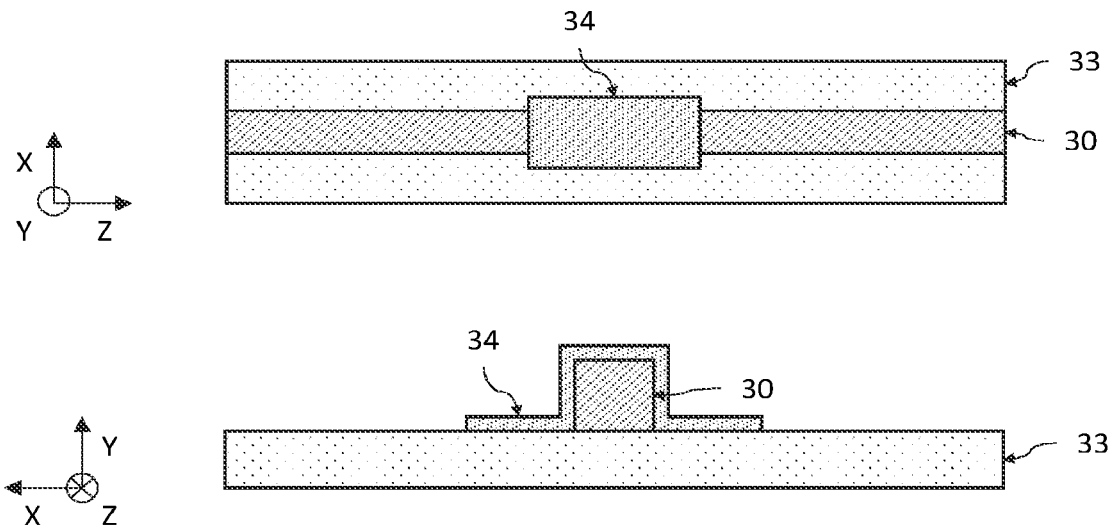
FIGS. 6A and 6B illustrate, viewed from above and in transverse cross section, one portion of the coupling device according to two other variant embodiments, in which phase-change segments are placed level with the intermediate waveguides in the correcting central section.
Figure 6B:
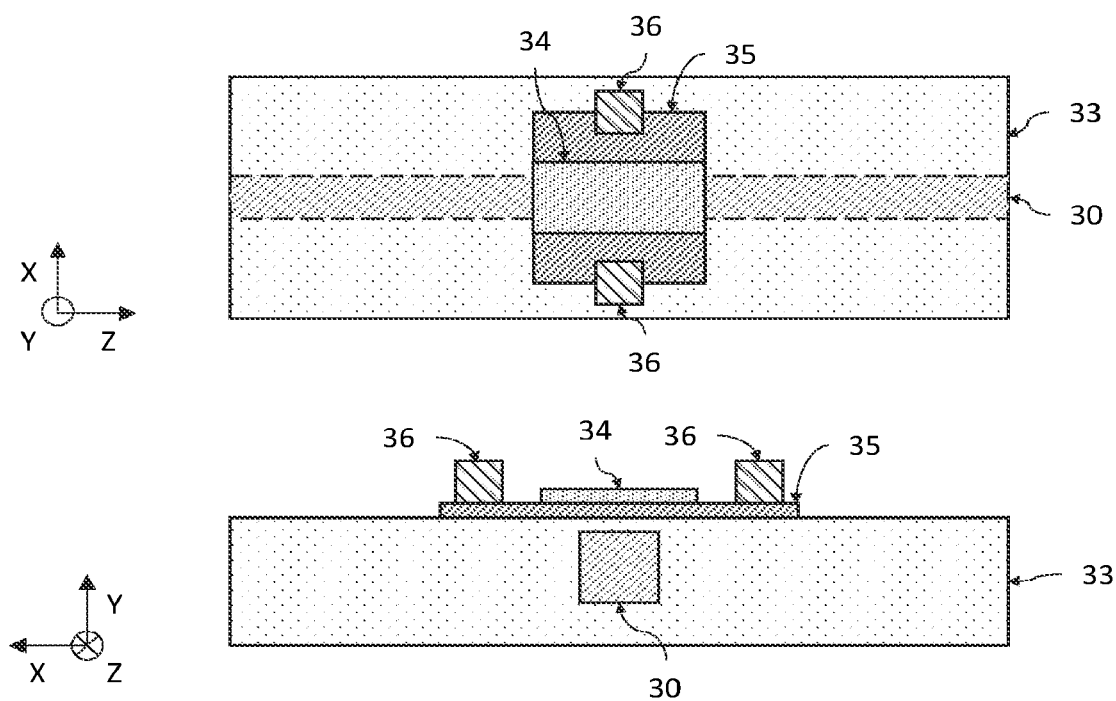

FIGS. 6A and 6B are schematic and partial views of one of the intermediate waveguides 30 level with the correcting central section ($S_c$), according to two other variant embodiments of the optoelectronic emitter. Here, the effective index of the guided mode in each of the intermediate waveguides 30 is varied by means of a phase-change material that participates in forming the cladding of the waveguide 30. The phase-change material may notably be chosen from among the chalcogenides, in particular of GST type, i.e. chalcogenides formed based on germanium Ge, antimony Sb and telluride Te. Reference may be made to the document by Abdollahramezani et al. titled *Tunable nanophotonics enabled by chalcogenide phase-change materials*, Nanophotonics 2020, 9(5), 1189-1241. The segments 34 of phase-change materials generate a relative phase shift, statically or dynamically, between the modes guided in the waveguides 30, which relative phase shift is predefined for each waveguide so that the optical paths of the waveguides 30 are identical to one another.

FIG. 6A illustrates, viewed from above and in transverse cross section, a first example in which the phase-change material has a crystalline phase that is defined beforehand in the process of manufacturing the coupling device. Here, the waveguide 30 rests on a substrate 33 that participates in forming the cladding. A segment 34 of phase-change material forming a thin layer has been deposited on and around the waveguide 30, and extends along the latter over a length comprised, for example, between 1 μm and 100 μm. It here has a uniform thickness, for example comprised between 5 nm and 100 nm. The crystalline phase of the phase-change material was defined during the manufacturing process, for example by means of laser pulses. The effective index of the guided mode therefore depends on the refractive index of the phase-change material (which depends on its crystalline phase).

FIG. 6B illustrates, viewed from above and in transverse cross section, a second example in which the phase-change material has a crystalline phase that may be dynamically (or statically) modified during the operation of the coupling device. Here, the waveguide 30 is buried in the substrate 33, which participates in forming the cladding. A heater 35 is placed on the surface of the substrate 33, above the waveguide 30, and lies on either side thereof along the X-axis. A segment 34 of phase-change material extends over the heater 35 and above the waveguide 30, over a length comprised, for example, between 1 μm and 100 μm. It here has a uniform thickness, for example comprised between 5 nm and 100 nm. Two electrodes 36 make contact with the heater 35. Thus, the application of a voltage across the electrodes 36 causes the heater 34 to heat up, which induces a variation in the crystalline phase of the phase-change material. The effective index of the guided mode is then modified as a result.

The invention claimed is:

1. Coupling device suitable for ensuring optical coupling between a flared laser source and an output waveguide on a photonic chip,
   the flared laser source
      comprising, along an optical axis Δ, a straight single-mode section, and a section that is flared in a main plane and that ends in a surface of emission of the optical signal,
      configured to emit an optical signal a wavefront of which, in the main plane, is circular and centred on a position $z_h$ located in the flared section on the optical axis Δ;

the coupling device comprising, placed on the photonic chip:

a coupler,
which is intended to be coupled to the flared laser source so as to collect and transmit at least one portion of the emitted optical signal,
and which comprises a curved and circularly arcuate output the centre of which is intended to be located at the position $z_h$;

a combiner,
which is coupled to intermediate waveguides so as to receive the optical signals transmitted by the latter, and to focus them on to an input of the output waveguide;
and which is a planar focusing lens comprising an input and an output bounding a free-propagation region of uniform refractive index, the input being curved and circularly arcuate and having a centre at a position $z_{gs}$ on the output face where the input of the output waveguide is located;

a network of intermediate waveguides,
which are coupled to the curved output of the coupler so as to receive the collected optical signal and to transmit it to the curved input of the combiner;
and which comprise:
a connecting upstream section in which they are orthogonally connected to the curved coupler output,
a connecting downstream section in which they are orthogonally connected to the curved combiner input,
a correcting central section located between the connecting upstream and downstream sections, in which section an effective index associated with the guided modes is adjusted so that the optical paths of the intermediate waveguides between the curved output of the coupler and the curved input of the combiner are identical to one another.

2. Coupling device according to claim 1, wherein the intermediate waveguides exhibit, in the correcting central section, a longitudinal variation in at least one transverse dimension, said longitudinal variation being predefined for each intermediate waveguide, so that the optical paths of the intermediate waveguides are identical to one another.

3. Coupling device according to claim 2, wherein each intermediate waveguide exhibits, in the correcting central section, an adiabatic variation in width, passing from a minimum first value that is identical for each intermediate waveguide to a maximum value that is different from one intermediate waveguide to the next, before then decreasing to a second minimum value that is identical for each intermediate waveguide.

4. Coupling device according to claim 1, comprising additional waveguides having a refractive index different from that of the intermediate waveguides, lying solely in the correcting central section, and each being arranged facing and parallel to one intermediate waveguide, so as to permit modal coupling to the intermediate waveguide in question, the additional waveguides having a predefined length that differs from one additional waveguide to the next, so that the optical paths of the intermediate waveguides are identical to one another.

5. Coupling device according to claim 1, comprising thermo-optic phase-shifters arranged solely in the correcting central section so as to generate, via the application of a temperature to the intermediate waveguides, a predefined phase shift between the optical modes in the intermediate waveguides so that the optical paths of the intermediate waveguides are identical to one another.

6. Coupling device according to claim 1, comprising segments of a phase-change material, which segments are located in the correcting central section, and are each associated with each intermediate waveguide, these segments participating in forming a cladding of the latter, the segments of phase-change materials generating, statically or dynamically, a relative phase shift between the modes guided in the intermediate waveguides, which phase shift is predefined for each of the intermediate waveguides so that the optical paths of the intermediate waveguides are identical to one another.

7. Coupling device according to claim 1, wherein the coupler is formed from a network of tapers, each taper being rectilinear and oriented in the direction of a given position intended to coincide with the position $z_h$, the tapers being arranged laterally so that their downstream ends are placed on a circular arc the centre of which is intended to be located at the position $z_h$, thus forming the curved output of the coupler.

8. Coupling device according to claim 1, wherein the coupler is a star coupler comprising an input face intended to be oriented orthogonally to the optical axis Δ, a curved output face, and a free-propagation region of uniform refractive index bounded by the input and output faces.

9. Photonic chip comprising a coupling device according to claim 1, and the output waveguide coupled to the combiner in the position $z_{gs}$, of its curved output.

10. Photonic chip according to claim 9, comprising a silicon-on-insulator substrate.

11. Optoelectronic system, comprising:
an emissive chip comprising a flared laser source which comprises, along an optical axis Δ, a straight single-mode section, and a section that is flared in a main plane and that ends in a surface of emission of the optical signal, and which is configured to emit an optical signal a wavefront of which, in the parallel plane, is circular and centred on a position $z_h$ located in the flared section on the optical axis Δ;
a photonic chip according to claim 9.

12. Optoelectronic system according to claim 11, the emissive and photonic chips being joined to each other by an adhesive layer.

* * * * *